United States Patent [19]

Utunomiya et al.

[11] Patent Number: 5,081,764
[45] Date of Patent: Jan. 21, 1992

[54] TERMINAL STRUCTURE AND PROCESS OF FABRICATING THE SAME

[75] Inventors: Jiro Utunomiya; Saburo Iida; Hitosi Sibuya; Kazunori Kusaba; Isao Narumi, all of Tokyo, Japan

[73] Assignee: Oki Electric Industry Co., Ltd., Tokyo, Japan

[21] Appl. No.: 563,320

[22] Filed: Jul. 26, 1990

Related U.S. Application Data

[62] Division of Ser. No. 486,611, Feb. 28, 1990, Pat. No. 4,989,318, which is a division of Ser. No. 361,658, Jun. 2, 1989, Pat. No. 4,985,747.

[30] Foreign Application Priority Data

Jun. 9, 1988 [JP] Japan ............... 63-140552
Jun. 9, 1988 [JP] Japan ............... 63-140553

[51] Int. Cl.$^5$ ............................................. H01R 9/09
[52] U.S. Cl. .................................... 29/843; 29/842; 29/860; 174/256; 174/260; 228/214
[58] Field of Search ............... 29/843, 842, 857, 860; 156/305; 174/256, 260; 228/180.2, 214

[56] References Cited

U.S. PATENT DOCUMENTS 3,414,775 12/1968 Melan et al. ............................ 29/843
3,579,770 5/1971 O'Mara et al. ....................... 29/25.42

FOREIGN PATENT DOCUMENTS 0287274 10/1988 European Pat. Off. .
3138285 4/1983 Fed. Rep. of Germany .
24405 2/1980 Japan .................................. 29/843
43446 3/1982 Japan .................................. 29/843
119250 7/1984 Japan .................................. 29/843
8804839 6/1988 PCT Int'l Appl. .

OTHER PUBLICATIONS

Patent Abstracts of Japan, vol. 10, No. 179 (E-414) (2235) of Jun. 24th, 1986.

*Primary Examiner*—P. W. Echols
*Attorney, Agent, or Firm*—Spencer & Frank

[57] ABSTRACT

A multiple-terminal unit comprises a first and a second group of teeth extending from one edge of a band-shaped. The teeth in the first group and the second group are bent at different positions so that their stem parts are staggered. In another aspect of the invention, the part at which a terminal and wiring pattern on a substrate a fixed by resin, preferably thixotropic resin.

17 Claims, 8 Drawing Sheets

FIG.8
FIG.9
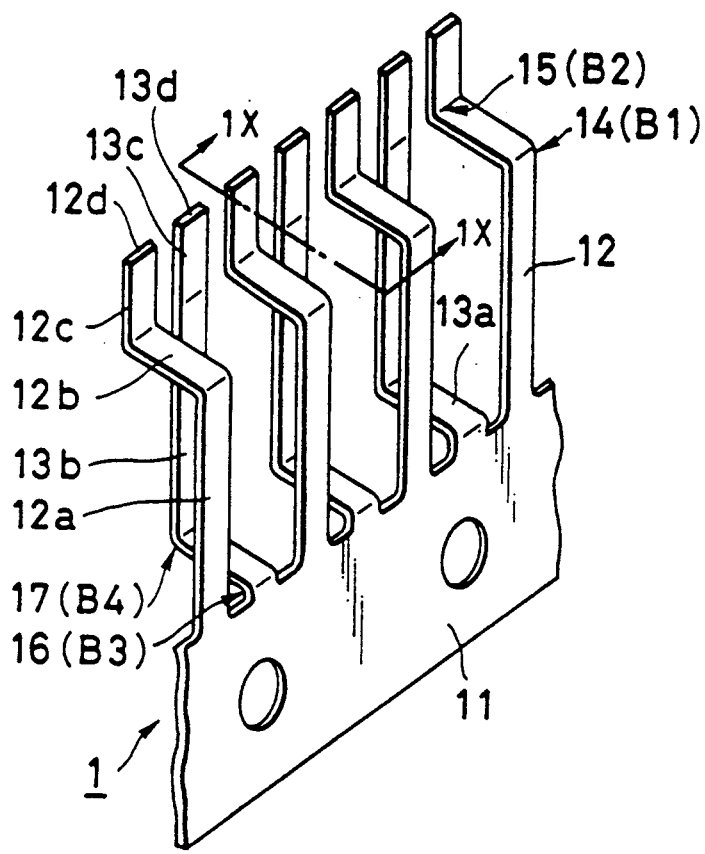
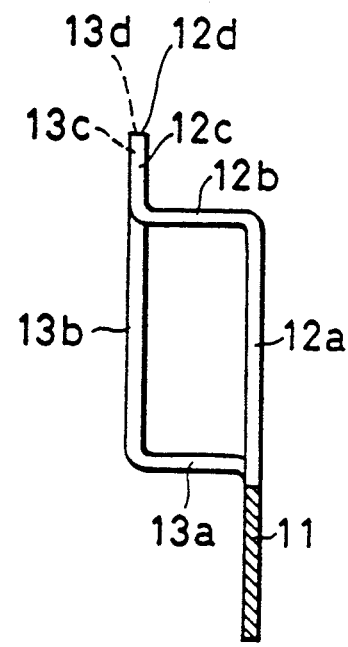

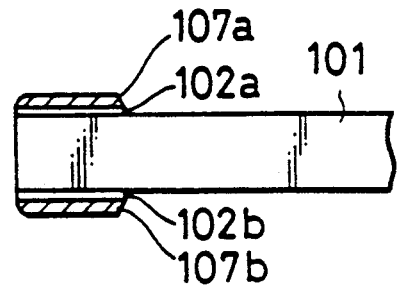
FIG.16A
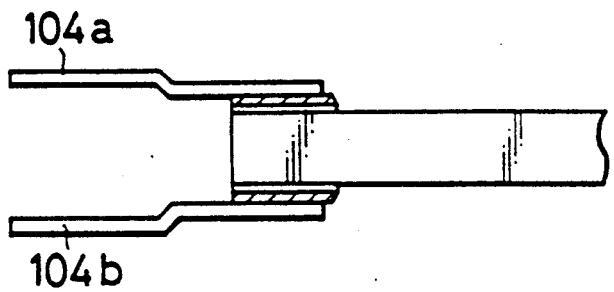
FIG.16B
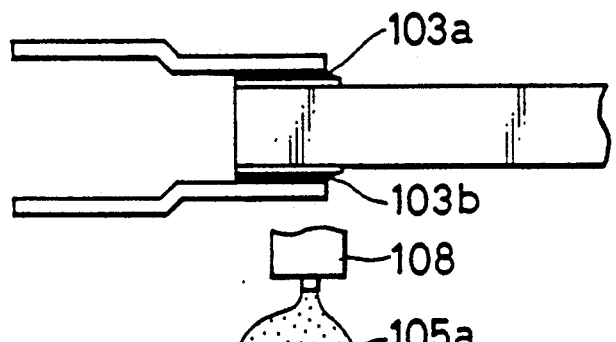
FIG.16C
FIG.16D
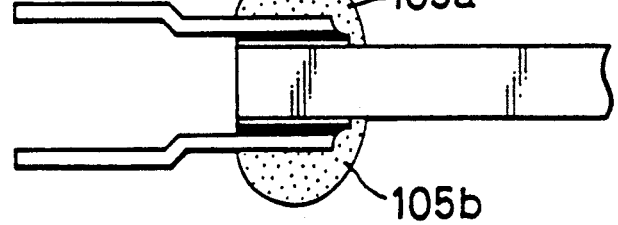

TERMINAL STRUCTURE AND PROCESS OF FABRICATING THE SAME

This is a division of application Ser. No. 07/486,611 filed Feb. 28th, 1990, now U.S. Pat. No. 4,989,318 which is a division of application Ser. No. 07/361,658 filed June 2nd, 1989 now U.S. Pat. No. 4,985,747.

BACKGROUND OF THE INVENTION

The present invention relates to a terminal structure and a process of fabricating it. In one aspect of the present invention, it relates to a process of fabricating a hybrid-IC device having a multiplicity of input and output terminals, and a terminal structure thereof.

In another aspect of the invention, it relates to a mounting structure for input and output terminals of modules such as IC, LSI, etc., and more particularly to a mounting structure for one-surface terminals.

A prior-art hybrid IC device of the type having a multiplicity of input and output terminals is soldered to a substrate by reflow of the components and the input and output terminals are also soldered onto the substrate. As shown in FIG. 1, one end of each lead 71 is bent to have an inverted U-shaped 73, and the tip 72 of the lead 71 is made to abut a soldering pad 75 substantially at right angles to permit soldering by reflow (Japanese Utility Model Application Kokai Publication No. 43,452/1988).

In another method shown in FIG. 2 in which input and output terminals are formed on one surface of the substrate, a lead frame 81 is formed substantially in a hat shape, a notch 84 is provided in part of the hat to clamp the substrate, soldering is performed by dipping, and the connecting part 83, is later removed to form lead terminals (Japanese Patent Application Kokai Publication No. 266,856/1987).

When the number of input and output terminals required in a hybrid IC device is large, it is not possible to connect all of them on one surface of the substrate, and it is necessary to connect them on both surfaces of the substrate. Moreover, the throughhole pitch of the mother board on which a hybrid IC device is mounted is standardized and is usually 2.54 mm for the reason of strength, easy manipulation, etc. To obtain connection of input and output terminals in a limited length of mounting, it is necessary to arrange them in a plurality of rows. However, with the prior-art terminal structures, it is different to fix, by reflow or soldering-dip, a multiplicity of terminals on both surfaces of the substrate.

Other problems of the prior art will now be described with reference to FIG. 3 to FIG. 7. The input and output terminals of modules such as IC's, LSI's, etc. (hereinafter simply referred to as modules) have such a structure shown in FIG. 3 to FIG. 7, and are connected to the substrate in the module.

FIG. 3 shows an example in which clip terminals are used. The substrate 101 of the module has a surface on which electronic components, devices, etc., not shown, are mounted, and these components, devices etc. are electrically connected by means of a wiring pattern, not shown. The wiring pattern has terminal pads 102a for connection with the input and output terminals at an end of the substrate 101. When the substrate 101 is inserted in the clip terminal 109, the clip terminal 109 clamps the substrate 101 by virtue of its resiliency. The clip terminal 109 and the substrate 101 are fixed provisionally. In this state, the clip terminal 109 and the terminal pads 102a are electrically connected by solder 103a, so good values are obtained with regard to the reliability of the connection resistance and the pull strength. Moreover, in recent years, a greater demand has existed for a higher density of mounting of electronic components. To meet this demand, wiring patterns 106a and 106b are provided as shown in FIG. 4, or additional terminal pads 102b are provided on the reverse surfaces of the substrate 101 as shown in FIG. 5. In these cases, the clip terminals shown in FIG. 3 cannot be used, so one-surface terminals 104c and 104e in abutment with one surface of the substrate 101 are used and fixed to terminal pads 102a with solder 103a.

With the structure shown in FIG. 3, the substrate is clamped on both surfaces, so wiring patterns and terminal pads cannot be disposed on the reverse surface of the substrate, and therefore the input and output terminals cannot be provided on both surfaces of the substrate. With the structure shown in FIG. 6 and FIG. 7, the terminals are in contact with only a single surface of the substrate, so there is a problem that the reliablity of the connection resistance and the pull strength is low compared with the clip terminals shown in FIG. 3. Moreover, because the terminals are on one surface and the substrate are fixed by solder alone, a large quantity of solder is required and the areas for the terminal pads are substantial.

SUMMARY OF THE INVENTION

An object of the present invention is to mount a multiplicity of terminals on both surfaces of a substrate for a hybrid IC device, and fix them by reflow.

Another object of the present invention is to provide a structure and a method for mounting a terminal having a high pull-strength and connection resistance reliability and reduced terminal pad areas, thereby to enable a high-density mounting.

In one aspect of the invention, a multiple-terminal unit comprises:

a band-shaped connecting part;

a first and second group of teeth extending from one edge of the connecting part;

said first group consisting of teeth provided at alternate positions and said second group consisting of teeth provided at intervening positions;

each tooth in said first group having a stem part having one end continuous with the connecting part and extending in the same plane as the connecting part, a lateral part having one end continuous with the other end of the stem part, and extending at an angle with the stem part, and an end part having one end continuous with the lateral part and extending in parallel with the stem part;

each tooth in said second group having a lateral part having one end continuous with the connecting part and extending at an angle with the connecting part, a stem part having one end continuous with the other end of the lateral part and extending in parallel with the connecting part, and an end part having one end continuous with the stem part and extending in the same plane as the stem part;

said end parts of said teeth in said first group and said second group being aligned with each other;

said stem parts of said teeth in said first group being aligned with each other;

said stem parts of said teeth in said second group being aligned with each other;

said stem parts of said teeth in said first group being shifted relative to said stem parts of said teeth in said second group in a direction of the thickness of the connecting part and also in the direction of the rows of the teeth of said first and second groups.

In another aspect of the invention:

a multiple-terminal unit formed as recited above is provided;

a substrate with soldering paste printed in pad regions on the substrate is provided;

the end parts of said teeth of said multiple-terminal unit are soldered with the printed soldering paste in the pad regions on the substrate; and the connecting part of the multiple-terminal unit is then removed.

The stem parts of the resultant terminals fixed to the substrate of the hybrid IC device are staggered, i.e., arranged in a zigzag manner. As a result, a throughhole pitch of a standardized value, e.g., 2.54 mm, of the mother board, is maintained, the strength and easy manipulation of the terminals are not impaired, and the terminals are disposed in a plurality of rows.

According to a further aspect of the invention, a mounting structure of a one-surface terminal has a contact with one surface only on a substrate for an electronic component module and electrically connected to a wiring pattern on the substrate, wherein the part at which said one-surface terminal and said wiring pattern are connected are fixed by resin, preferably thixotropic resin.

According to a further aspect of the invention, in a process for mounting a terminal having contact with a surface of a substrate for an electronic component module and electrically connected to a wiring pattern on the substrate:

said one-surface terminal and said wiring pattern are soldered;

resin is applied on the part of the connection; and the resin is hardened to fix said substrate and said one-surface terminal.

By use of the resin which is hardened, the connection at the soldering part is enhanced.

Preferably, the above-mentioned resin is a thixotropic resin. Use of thixotropic resin is advantageous in that it can completely cover the part of the connection and has such a viscosity and does not flow out of the part in which it is applied. More specifically, the resin applied to the part of connection of the terminal has a property of a thixotropic fluid. When a shearing deformation is given to the resin, the viscosity of the resin is lowered, so it can easily be applied to the area around the terminal. Moreover, after the application its viscosity is restored with time. As a result, the resin adheres to the substrate and it is prevented from flowing out of the terminal pads and off the substrate.

BRIEF DESCRIPTION OF THE DRAWINGS

FIG. 8 is an oblique view showing a multiple-terminal unit of an embodiment of the invention.

FIG. 9 is a sectional view along line IX—IX in FIG. 8.

FIGS. 16A to 16D are diagrams showing the steps of mounting of the one-surface terminals according to the invention.

DETAILED DESCRIPTION OF THE EMBODIMENTS

Figure 1:
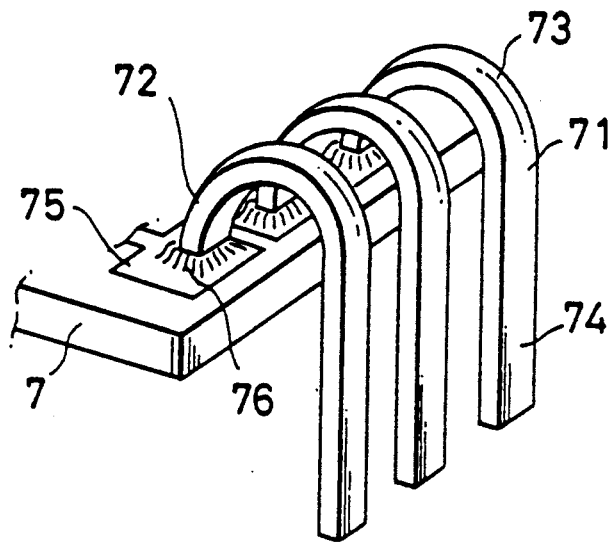
FIG. 1 and FIG. 2 show prior art terminal units.
Figure 2:
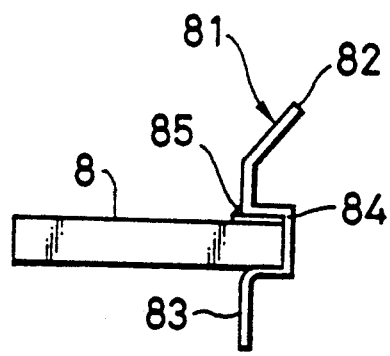
Figure 3:
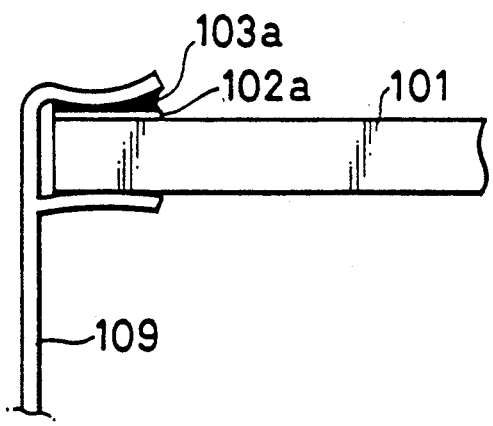
FIGS. 3 to 7 are side sectional views showing prior-art terminal mounting structures.
Figure 4:
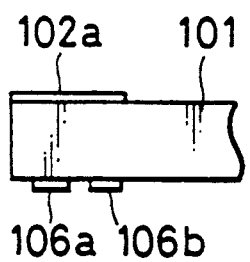
Figure 5:
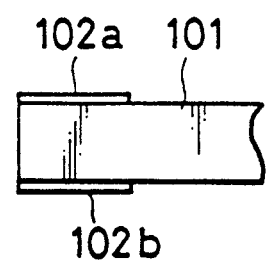
Figure 6:
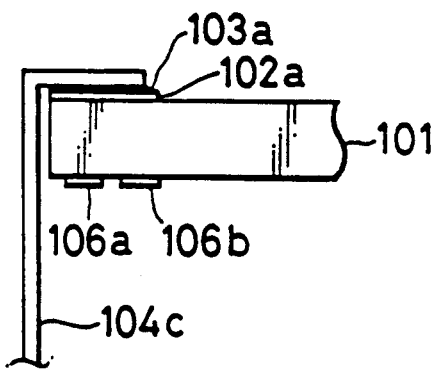
Figure 7:
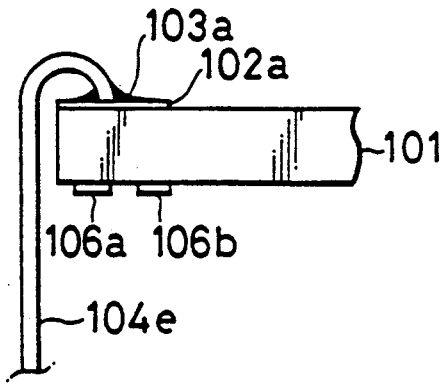

FIG. 8 is an oblique view showing a multiple-terminal unit of an embodiment of the invention. FIG. 9 is a sectional view along line IX—IX in FIG. 8.

As illustrated, the multiple-terminal unit 1 comprises a substantially band-shaped connecting 11, and a first group of teeth 12 and a second group of teeth 13 extending from one edge of the band-shaped connecting part 11. Each of the teeth 12 in the first group has a first stem part 12a having one end continuous with the connecting part 11 and extending in the same plane as the connecting part 11, a lateral part 12b having one end continuous with the other end of the stem part 12a and extending at an angle, e.g., almost at a right angle, with the stem part 12a, and an end part 12c having one end continuous with the other end of the lateral part 12b and extending in parallel with the stem part 12a. Each of the teeth 13 in the second group has a lateral part 13a having one end continuous with the connecting part 11 and extending at an angle, e.g., almost at a right angle, with the connecting part 11, a stem part 13b having one end continuous with the other end of the lateral part 13a and extending in parallel with the connecting part 11, and an end part 13c having one end continuous with the other end of the stem part 13b and extending in the same plane as the stem part 13b. The end parts 12c and 13c of the teeth 12 and 13 in the first and second groups are all aligned with respect to each other along a single row, and the extremities 12d and 13d of end parts 12c and 13c are all aligned with respect to each other.

The stem parts 12a of the teeth 12 in the first group are aligned with each other and are arranged at a pitch equal to the throughhole pitch of the mother board on which the hybrid IC device is to mounted, and the stem parts 13b of the teeth 13 in the second group 13 are aligned with each other and are arranged at the same pitch as that of the stem parts 12a. The stem parts 12a and 13b of the teeth 12 and 13 are shifted in the lateral direction, i.e., the direction of the thickness of the connecting part 11, and are also shifted relative to each other in the direction of the rows of the teeth 12 and 13. The distance by which the stem parts 12a and 13b of the teeth 12 and 13 are shifted relative to each other in the lateral direction is the above-mentioned throughhole pitch of the mother board, and the distance by which the stem parts 12a and 13b are shifted relative to each other in the direction of the rows of the teeth 12 and 13 is half that of the above-mentioned throughhole pitch of the mother board.

Figure 10:
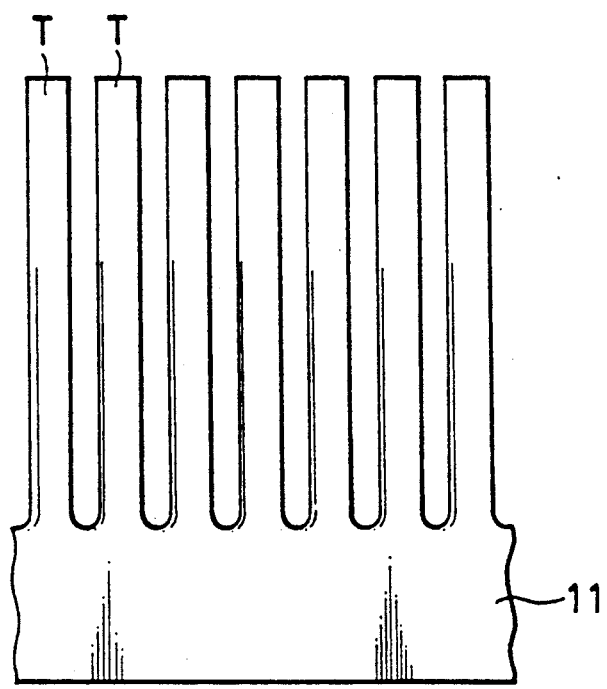
FIG. 10 is a partial view of a comb-shaped pattern from which the multiple-terminal unit of FIG. 8 is formed.

The terminal unit 1 showsn in FIG. 8 and FIG. 9 can be formed by continuous punching and bending. That is, a metal sheet is punched to form a comb-shaped pattern of metal sheet, as illustrated in FIG. 10. As illustrated in FIG. 10, the comb-shaped pattern has the connecting part 11 and teeth T which will later become the teeth 12 and 13.

The comb-shaped pattern is then subjected to a bending process to result in the structure as shown in FIG. 8. During the bending, alternate teeth T are bent at about a right angle in a first direction to form a convex bend 14 at a first position B1 relatively far from the connecting part 11, and also bent at about a right angle to form a concave bend 15 at a second position B2 at a height (position in the vertical direction as seen in FIG. 8 and FIG. 9) close to the height of the convex bend B1. The intervening teeth T are bent at about a right angle to form a convex bend 16 at a third position B3 close to the connecting part 11, and also bent at about a right angle at a fourth position B4 to form a concave bend 17 at a height (position in the vertical direction as seen in FIG. 8 and FIG. 9) close to height of the convex bend B3.

Each of the teeth 12 and 13 has two bends, one convex bend and one concave bend, so that if the lengths of the teeth T before the bending process are identical, the positions of the ends 12d and 13d of the end part 12c and 13c are aligned with each other provided that the angles of the bends 14, 15, 16 and 17 and the dimensions of the lateral parts 12b and 13b are identical.

Figure 11A:
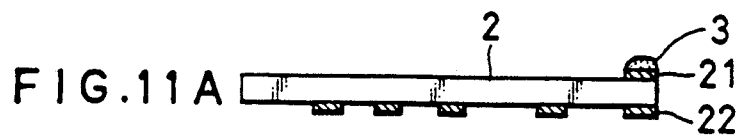
FIGS. 11A to 11E are side views showing various steps of the process for mounting terminals onto a substrate of a hybrid IC device.
Figure 11B:
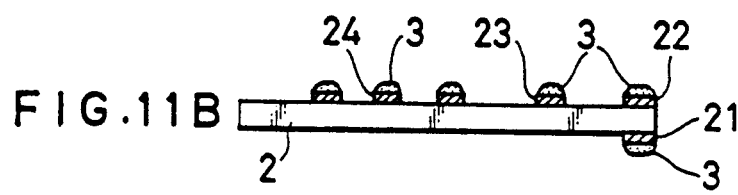
Figure 11C:
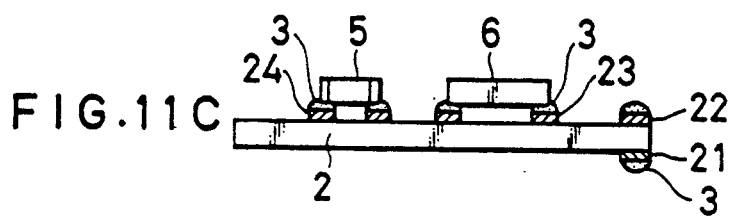
Figure 11D:
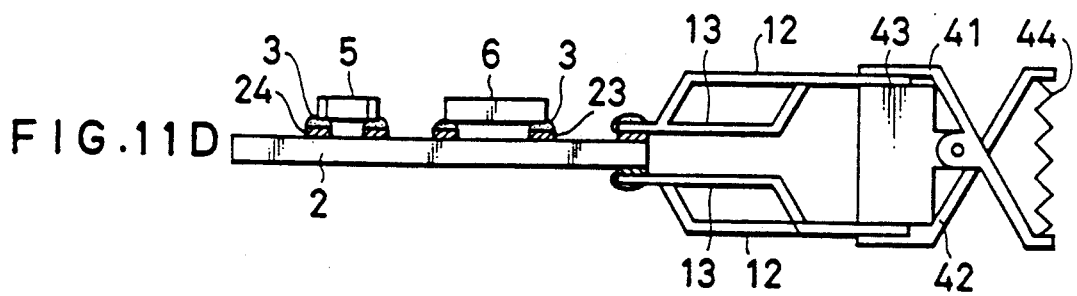
Figure 12:
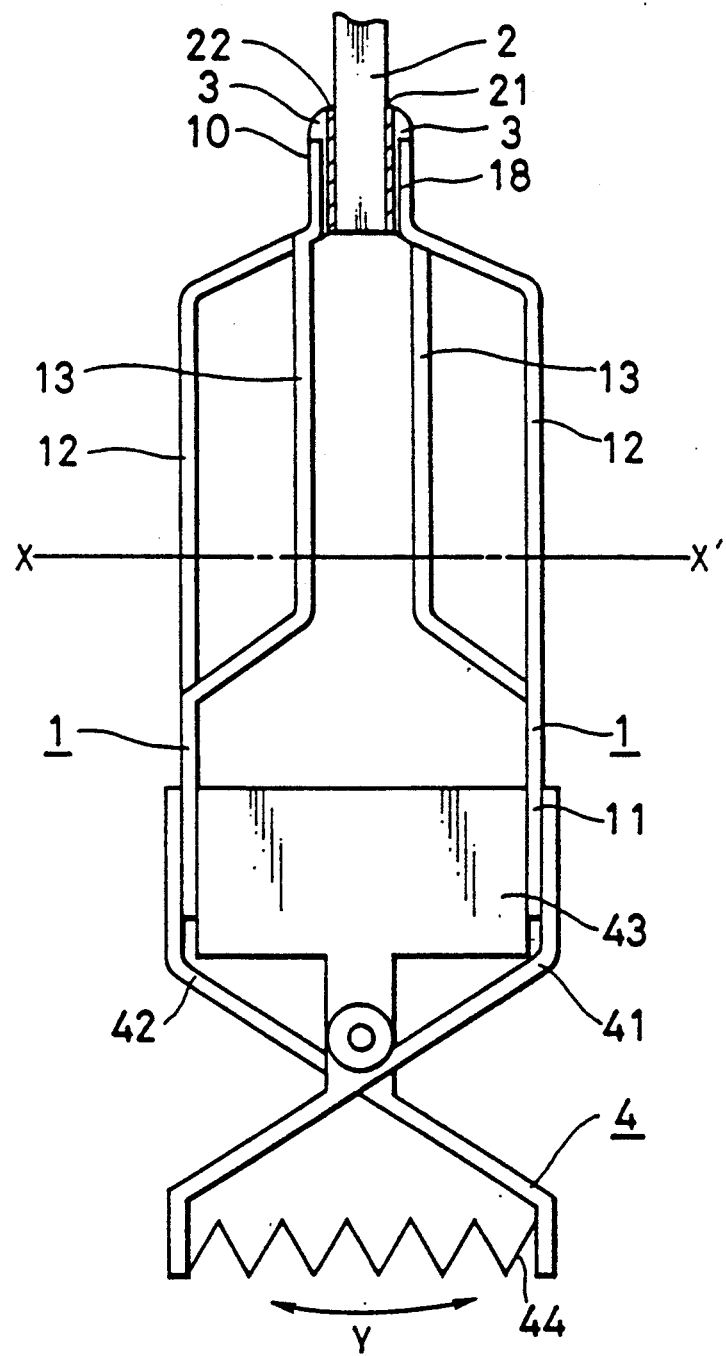
FIG. 12 is an enlarged view showing how the multiple-terminal units are set on the substrate.

The end parts 12c and 13c form soldering parts, which will be fixed to terminal pads of a substrate 2 shown in FIG. 11D and FIG. 12.

FIGS. 11A to 11E show how a hybrid IC is formed using the terminal units of the above embodiment.

FIG. 11A shows a substrate 2 with solder paste 3 having been printed on its reverse surface. Usually, solder paste 3 is printed only for the terminal pads 21 on the substrate 2. Then, as shown in FIG. 11B, solder paste 3 is printed on the component mounting surface (obverse surface) of the substrate 2, for the terminal pads 22, and component pads 23 and 24. Then, as shown in FIG. 11C, components 5 and 6 are mounted. Then, as shown in FIG. 11D, a pair of the multiple-terminal units 1 are set or fixed to the substrate 2.

FIG. 12 shows in greater detail how the multiple-terminal units 1 are fixed onto a substrate 2. Two multiple-terminal units 1 are used in combination, and are made to confront each other, and their connecting parts 11 are held between a fixed block 43 and clamping parts 41 and 42 of a clamp jig 4. In this state, the soldering parts 18 of the multiple-terminal units 1 held by the clamp jig 4 are little widened and, the soldering parts 12 of the multiple-terminal units 1 are made to abut the terminal pads 21 and 22 of the substrate 2. By virtue of resiliency of the spring 44, the substrate 2, the multiple-terminal units 1 and the clamping jig 4 are held.

The assembly is then passed through a reflow apparatus, and the components 5 and 6, and the multiple-terminal units 1 are simultaneously soldered. As a result, the terminal pads 21 and 22 on the substrate 2 and the soldering parts 18 of the terminal units 1 are fixed and connected by solder 3.

Figure 11E:
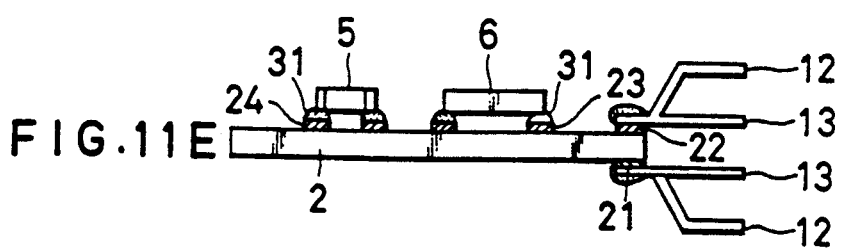

Then, the stem parts 12a and 13b of the teeth 12 and 13 of the terminal units 1 are cut at the same height (vertical position as seen in FIG. 12), and the parts below (as seen in FIG. 12) the cut line X—X' in FIG. 12 which include the connecting parts 11 and the lower (as seen in FIG. 12) parts of the stem parts 12a and the stem parts 13b, and the lateral parts 13a are removed. The resultant structure is shown in FIG. 11E.

Figure 13:
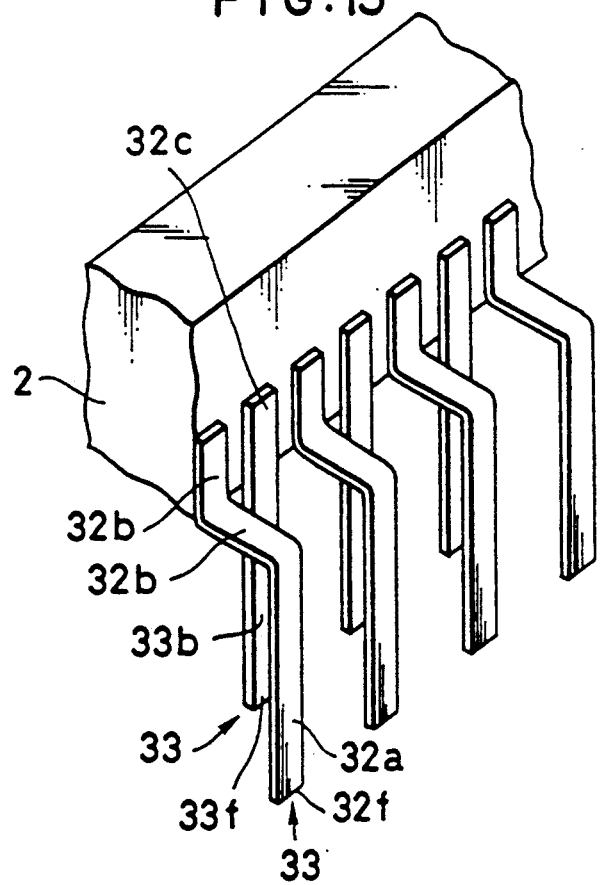
FIG. 13 is an oblique view showing the terminals formed on the substrate.

The parts of the teeth 12 and 13 which remain fixed to the substrate 2 after the cut form the pins or terminals for the substrate 2. As is better seen from FIG. 13, the terminals can be divided into two groups, the first group consisting of terminal 32 at alternate positions and the second group consisting of terminals 33 at intervening positions. The terminals 32 of the first group are formed from the teeth 12 of the first group. The terminals 33 of the second group 33 are formed from the teeth 13 of the second group.

Each of the terminals 32 in the first group has a soldering part 32c which is formed of the end part 12c of each tooth 12, a lateral part 32b which is formed of the lateral part 12b, and a stem part 32a which is formed of the upper (as seen in FIG. 12) part of the stem part 12a of the tooth 12. Each of the terminals 33 in the second group has a soldering part 33c which is formed of the end part 13c of each tooth 13, and a stem part 33b which is formed of the upper (as seen in FIG. 12) part of the stem part 13b of the tooth 13.

The ends (extremities) 32f, and 33f of the stem parts 32a and 33b, respectively, form soldering parts, which will be inserted in and soldered to throughholes in the mother board, not shown.

The stem parts 32a of the terminals 32 in the first group are aligned with each other and are arranged at a pitch equal to the throughhole pitch of the mother board, and the stem parts 33b of the terminals 33 in the second group are aligned with each other and are arranged at the same pitch as that of the stem parts 32a. The stem parts 32a and 33b of the terminals 32 and 33 are shifted relative to each other in the lateral direction, and are also shifted relative to each other in the direction of the rows of the terminals 32 and 33. The distance by which the stem parts 32a and 33b of the terminals 32 and 33 are shifted relative to each other in the lateral direction is the above-mentioned throughhole pitch of the mother board, and the distance by which the stem parts 32a and 33b are shifted relative to each other in the direction of the rows of the terminals 32 and 33 is half that of the above-mentioned throughhole pitch of the mother board. Thus, the extremities 32f and 33f of the terminals 32 and 33 are staggered or arranged in a zig-zag manner.

As has been described, according to the above embodiment of the invention, the input and output terminals of a hybrid IC device are formed, being staggered, and a high-density mounting is therefore possible. Because the terminals adjacent to each other are both bent at a first position and a second position in the same way, the layout size for the continuous punching and bending process can be minimized, and a high-precision is achieved in the dimension of the resultant structure. Moreover, the assembly of the terminals are reflowed simultaneously with the mounted components so that the cost for the multiple-terminal units are lowered. It is therefore possible to provide a multiple-terminal hybrid IC device of a low cost suitable for a high density mounting.

Figure 14:
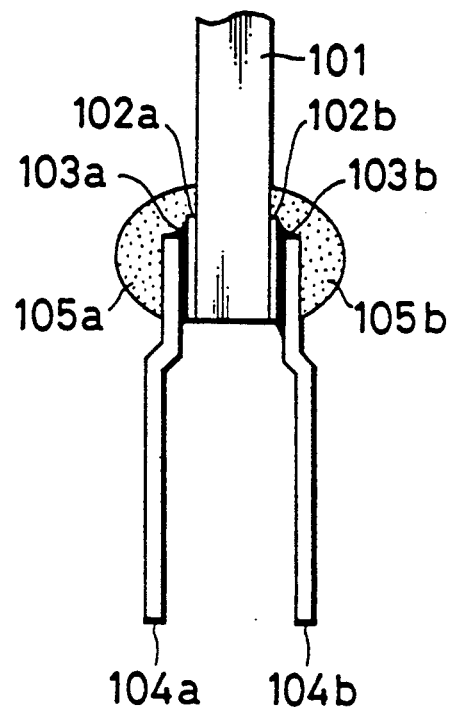
FIG. 14 is a side view showing another embodiment of the invention, in which terminal pads are provided on both surfaces of the substrate.

Another embodiment of the invention will now be described with reference to FIG. 14. In this embodiment, terminal pads are provided on both surfaces of the substrate.

Formed at an end of the substrate 101 are terminal pads 102a on one surface thereof and terminal pads 102b on the other surface thereof. These terminal pads 102a and 102b both form part of a wiring pattern, not shown, which is formed on the substrate 101. Connected to the terminal pads 102a and 102b are one-surface terminals 104a and 104b by means of solder 103a and 103b. The wiring pattern, not shown, on the substrate 101 and the one-surface terminals 104a and 104b are thereby electrically connected. Contiguous masses of resin 105a, 105b cover the connection parts and their immediate vicinity and fixes the substrate 101 and the one-surface terminals 104a and 104b as shown in FIG. 14.

The resin 105a, 105b must have a sufficient strength to fix the substrate 101 and the one-surface terminals 104a and 104b, and must not flow out of the application area when applied onto the substrate 101. Resin having a thixotropic property is preferable. In an ordinary state, this resin has a viscosity of 1000 to 1500 poise when measured using B8H-type viscosity meter, under the condition of rotor No. 7, a rotational speed of 20 rpm and a temperature of 25° C., and in the method defined by JIS-C-2105. The resin has a thixotropy index of 1.0 to 1.5. The thixotropy index is a value defined by the following equation:

$$\text{Thixotropy index} = \frac{\text{viscosity at 10 rpm}}{\text{viscosity at 20 rpm}}$$

Here, the viscosity is measured using the B8H-type viscosity meter, the rotor No. 7 and at the temperature 25° C., and in compliance with JIS-K-6838.

Since the resin has the above-described viscosity and thixotropy index, the resin can be easily applied to the substrate and does not flow out of the application area after being applied.

Figure 15:
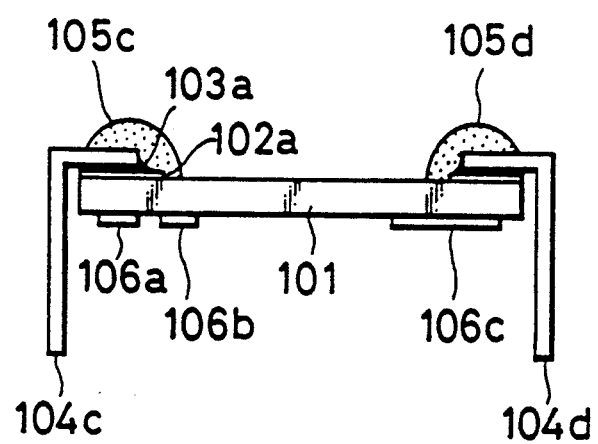
FIG. 15 is a side sectional view showing another embodiment of the invention.

FIG. 15 is a side sectional view showing another embodiment of the invention, in which terminal pads 102a are formed on both ends on one surface of the substrate 101. Electrically connected to the terminal pads 102a by means of solder 103a are one-surface terminals 104c and 104d. Formed on the other surface of the substrate 101 are wiring patterns 106a, 106b and 106c. As is in the embodiment of FIG. 14, the substrate 101 and the one-surface terminals 104c and 104d are fixed by resin 105c, 105d.

Mounting of the one-surface terminals shown in the embodiment of FIG. 14 will now be described with reference to FIG. 16A to FIG. 16D.

On both surfaces of an end of the substrate 101, terminal pads 102a and 102b are formed. On the terminal pads 102a and 102b, solder cream 107a, 107b is printed (FIG. 16A).

Next, the one-surface terminals 104a and 104b are made to abut the surface of the printed solder cream 107a (FIG. 16B), and soldering and fixing are effected by reflow. The soldering pads 102a and 102b, and the one-surface terminals 104a and 104b are thus bonded and electrically connected (FIG. 16C).

Subsequently, resin 105a, 105b is emitted from a dispenser 108, and applied onto the terminal pads 102a and 102b, and the one-surface terminals 104a and 104b and their immediate vicinities (FIG. 16D).

The resin 105a, 105b is thixotropic fluid, and its viscosity decreases with time when shearing deformation or shearing velocity is given. Its viscosity restores when it is left without giving the shearing deformation or shearing velocity. That is, the apparent viscosity varies reversibly.

In FIG. 16D, when the resin 105a, 105 b is applied onto the terminal pads 102a and 102b, shearing deformation is given by the dispenser 108. As a result, the viscosity is lowered and the resin 105a, 105b is easily emitted from the dispenser 108 and applied onto the terminal pads 102a and 102b.

After the resin 105a, 105b is applied onto the terminal pads 102a and 102b and left for a certain period of time, the viscosity of the resin returns to the original state. With the viscosity in the original state, the resin 105a, 105b adheres to the substrate 101 and does not flow out of the terminal pads 102a and 102b even if the substrate 101 is inclined. The resin is therefore kept attached to the part at which the terminal pads 102a and 102b and the one-surface terminals 104a and 104b are connected. Finally, the resin 105a, 105b is hardened by heating or the like, so that the substrate 101 and the one-surface terminals 104a and 104b are fixed.

According to the embodiments described with reference to FIG. 14, FIG. 15 and FIGS. 16A to 16D, in a mounting structure of one-surface terminals, after the substrate and the one-surface terminals are solder-bonded, resin having such a viscosity and such a thixotropic property by which the resin can completely cover the bond part and does not flow out of the bond part is applied, and hardened to fix the substrate and the one-surface terminals. The pull strength of the one-surface terminals after the mounting, and the reliability on the connection resistance can be improved. Moreover, it is possible to form a module which has different input and output terminals between the obverse and reverse surfaces. Furthermore, a sufficient mounting strength can be obtained even when the areas of the terminal pads are reduced. Mounting with even a higher density can therefore be achieved.

What is claimed is:

1. A process of mounting a terminal on a substrate so as to contact only one surface of the substrate, comprising the steps of:
   providing a substrate for an electronic component module, the substrate having a wiring pattern on one surface thereof;
   electrically and mechanically connecting the terminal and the wiring pattern by soldering together a part of the wiring pattern on the one surface and a part of the terminal; and
   reinforcing the mechanical connection of the wiring pattern and the terminal by
      applying thixotropic resin only on and in an immediate vicinity of the respective parts of the terminal and the wiring pattern, and
      hardening the resin.

2. A process according to claim 1, wherein the resin has a thixotropy index of about 1.0 to 1.5.

3. A process according to claim 1, further comprising the step of imposing a shearing deformation on the resin during said step of applying thixotropic resin.

4. A process according to claim 1, wherein the thixotropic resin is applied by emitting the resin from a dispenser.

5. A process according to claim 1, wherein said step of applying thixotropic resin includes the step of emitting the resin from a dispenser onto the respective parts of the terminal and the wiring pattern, the emission of the thixotropic resin imposing a shearing deformation on the resin.

6. A process according to claim 1, wherein:
   the substrate has the wiring pattern on opposite first and second surfaces thereof,
   each of a plurality of terminals is electrically and mechanically connected to the wiring pattern by soldering a part of each terminal to a corresponding part of the wiring pattern on only a corresponding one of the first and second surfaces and the mechanical connections of the wiring pattern and the terminals are reinforced by applying masses of thixotropic resin only on and in respective immediate vicinities of the respective soldered together parts of the wiring pattern and the terminals and hardening the masses of resin.

7. A process according to claim 1, further comprising the step of mounting the electronic component to the substrate in electrical contact with the wiring pattern.

8. A process for mounting a terminal on a substrate for an electronic component module so that the terminal contacts only one surface of the substrate, the substrate having a wiring pattern on the one surface, said process comprising the steps of:

electrically and fixedly connecting together the terminal and the wiring pattern at a part of the wiring pattern on the one surface and a part of the terminal; and reinforcing the mechanical connection of the wiring pattern and the terminal by applying a contiguous mass of thixotropic resin only on and in an immediate vicinity of the respective parts of the terminal and the wiring pattern, and then hardening the mass of thixotropic resin, while leaving free of thixotropic resin portions of the wiring pattern and the one surface.

9. A process according to claim 8, wherein said step of electrically and mechanically connecting comprises the step of soldering together the part of the wiring pattern and the part of the terminal.

10. A process according to claim 8, further comprising the step of imposing a shearing deformation on the applied resin during said step of applying a mass of thixotropic resin.

11. A process according to claim 8, wherein the thixotropic resin is applied by emitting the resin from a dispenser.

12. A process according to claim 8, wherein said step of applying thixotropic resin includes the step of emitting the resin from a dispenser onto the respective parts of the terminal and the wiring pattern, the emission of the thixotropic resin imposing a shearing deformation on the resin.

13. In a process for forming an electronic component module having a substrate and a wiring pattern on at least one surface of the substrate, the process including mounting an electronic component on the substrate in electrical contact with the wiring pattern and providing a terminal in contact with only one surface of the substrate, the improvement comprising the steps of:

electrically and fixedly connecting together a part of the wiring pattern on the one surface and a part of the terminal;

applying thixotropic resin only on and in an immediate vicinity of the respective parts of the terminal and the wiring pattern; and hardening the resin to reinforce the mechanical connection of the wiring pattern and the terminal.

14. A process according to claim 13, wherein said step of electrically and mechanically connecting comprises the step of soldering together the part of the wiring pattern and the part of the terminal.

15. A process according to claim 13, further comprising the step of imposing a shearing deformation on the resin during said step of applying thixotropic resin.

16. A process according to claim 13, wherein the thixotropic resin is applied by emitting the resin from a dispenser.

17. A process according to claim 13, wherein said step of applying thixotropic resin includes the step of emitting the resin from a dispenser onto the respective parts of the terminal and the wiring pattern, the emission of the thixotropic resin imposing a shearing deformation on the resin.

* * * * *